(12) United States Patent
Van Empel et al.

(10) Patent No.: US 7,446,849 B2
(45) Date of Patent: Nov. 4, 2008

(54) LITHOGRAPHIC APPARATUS AND DEVICE MANUFACTURING METHOD

(75) Inventors: Tjarko Adriaan Rudolf Van Empel, Eindhoven (NL); Erik Roelof Loopstra, Heeze (NL); Antonius Johannes Van Der Net, Tilburg (NL); Yuri Johannes Gabriel Van De Vijver, Best (NL); Bernard Gellrich, Aalen (DE); Bauke Jansen, Deurne (NL); Rens Sanderse, Eindhoven (NL)

(73) Assignees: ASML Netherlands B.V., Veldhoven (NL); Carl Zeiss SMT AG, Oberkochen (DE)

( * ) Notice: Subject to any disclaimer, the term of this patent is extended or adjusted under 35 U.S.C. 154(b) by 603 days.

(21) Appl. No.: 10/896,000

(22) Filed: Jul. 22, 2004

(65) Prior Publication Data
US 2006/0017894 A1 Jan. 26, 2006

(51) Int. Cl.
G03B 27/52 (2006.01)
G03B 27/42 (2006.01)

(52) U.S. Cl. .......................................... 355/30; 355/53

(58) Field of Classification Search .................. 355/30, 355/53, 67, 72, 75; 250/548; 356/399–401
See application file for complete search history.

(56) References Cited

U.S. PATENT DOCUMENTS

| | | | |
|---|---|---|---|
| 5,701,169 A * | 12/1997 | Yoshioka | 355/30 |
| 6,222,610 B1 * | 4/2001 | Hagiwara et al. | 355/30 |
| 6,630,985 B2 * | 10/2003 | Hase | 355/30 |
| 6,671,033 B2 * | 12/2003 | Akagawa et al. | 355/30 |

* cited by examiner

*Primary Examiner*—Hung Henry Nguyen
(74) *Attorney, Agent, or Firm*—Pillsbury Winthrop Shaw Pittman, LLP

(57) ABSTRACT

A lithographic apparatus is disclosed. The apparatus includes a projection system configured to project a patterned radiation beam onto a target portion of a substrate. The projection system includes a housing and a plurality of optical elements arranged in the housing. The apparatus also includes an inlet for feeding conditioned gas to the housing and a gas exhaust for exhausting the conditioned gas from the housing for providing a gas conditioned environment in the housing. At least one gate is provided for providing communication of the gas conditioned environment with ambient atmosphere. The gate is arranged to provide a predetermined leakage of the conditioned gas to the ambient atmosphere.

20 Claims, 8 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus as here above specified, the optical elements of the projection system are mounted in a lens housing that is kept at a predefined conditioned environment, usually provided by a gas flow of inert gases. Typically, He gas is used or N2 gas or the like for keeping the lens environment clean and stable which is vital for imaging quality and life span of the projection system. However, such conditioned environment should be separate from the ambient environment, for example, the clean room environment, which, in a sense of the projection system is not clean at all. This causes problems, for example, when a door opens, a pressure drop of some 15 Pa may occur, which results in a momentary pressure difference between the ambient environment en the inner housing of the projection system. Such pressure differences may cause unwanted optical effects, for example, by mechanical deformation of optical elements etc. Although these problems are recognized in the art, and pressure stabilization systems have been developed that are designed to level pressure differences between the gas conditioned environment and the ambient environment, usually, these systems have a large response time which is not adequate for responding to sudden fluctuations. Therefore, generally, the gas conditioned environment follows general pressure fluctuations on a larger time scale, but fails to adequately respond on shorter time scales.

SUMMARY

It is an aspect of the present invention to provide a lithographic apparatus to provide a projection lens system having a gas conditioned environment that is less sensitive to ambient atmosphere variations.

It is an aspect of the present invention to address short term pressure fluctuations and provide a lithographic apparatus that is capable of responding to pressure fluctuations on a much smaller time scale.

It is an aspect of the present invention to provide a device manufacturing method in which problems due to ambient atmosphere variations are properly addressed, resulting in improved image quality, improved lifespan of the projection system and easier handling thereof.

According to an aspect of the invention, a lithographic apparatus is provided. The apparatus includes a projection system configured to project a patterned radiation beam onto a target portion of a substrate. The projection system includes a housing and a plurality of optical elements arranged in the housing. The apparatus also includes a feeding structure, or inlet, for feeding conditioned gas to the housing, and a gas exhaust structure for exhausting the conditioned gas from the housing for providing a gas conditioned environment in the housing. In this way, the gas conditioned environment is communicatively coupled to ambient atmosphere variations of the ambient atmosphere without contaminating the environment. Thus, the projection quality of the optical system is less influenced by ambient atmosphere variations.

According to an aspect of the invention, there is provided a lithographic apparatus of the above identified kind, wherein at least one gate is provided for providing communication of the gas conditioned environment with ambient atmosphere arranged to provide a controlled leakage of the conditioned gas to the ambient atmosphere. In this way, the gas conditioned environment is communicatively coupled to ambient atmosphere variations of the ambient atmosphere without contaminating the environment. Thus, the projection quality of the optical system is less influenced by ambient atmosphere variations. In particular, by such gate, the optical elements are less subject to pressure differences between the gas conditioned environment and the ambient atmosphere environment, so that mechanical deformation of optical elements is prevented and an improved imaging resolution is obtained.

According to an aspect of the invention, a lithographic apparatus is provided. The apparatus includes a projection system configured to project a patterned radiation beam onto a target portion of a substrate. The projection system includes a housing and a plurality of optical elements arranged in the housing, and an exit optical element for exiting the radiation beam from the projection system. The apparatus also includes an inlet for feeding conditioned gas to the housing for providing a gas conditioned environment in the housing, and a mount for mounting the exit optical element. The mount includes a suspension mounted on the exit optical element for suspending the exit optical element at a predetermined distance from a seat formed by a lower part of the housing so as to form a gas exhaust structure for exhausting the conditioned gas from the housing. In such a lithographic apparatus, the mount is provided for suspending the exit optical element at a predetermined distance from a seat formed by a lower part of the housing so as to form a gas exhaust structure for exhausting the conditioned gas from the housing. Such mount forms a preferred embodiment of the arrangement previously described, since not only a controlled communication is provided between the gas conditioned environment and the ambient environment, but also a mounting structure is provided which is mechanically much more stable than conventional mountings. These conventional mountings, due to a gas tight coupling of the exit optical element and the lens housing, generally suffer from in plane bending stresses of the optical exit element caused by thermally unstable mounting, which may result in imaging degradation of the optical system.

The inventive mounting, in contrast, is, due to the non contact coupling of the exit optical and the lens seat, less subject to mechanical deformation, at least, in a much less severe way since the suspension elements can be designed to compensate mechanical stress.

According to an aspect of the invention, there is provided a device manufacturing method. The method includes projecting a patterned beam of radiation onto a target portion of a substrate with a projection system. The projection system includes a plurality of optical elements arranged in a gas conditioned environment. The method also includes communicating the gas conditioned environment with ambient atmosphere so as to provide a controlled leakage of the conditioned gas to the ambient atmosphere.

According to an aspect of the invention, there is provided a device manufacturing method. The method includes projecting a patterned beam of radiation onto a target portion of a substrate with a projection system. The projection system includes a plurality of optical elements arranged in a gas conditioned environment. The method also includes exhausting conditioned gas from the gas conditioned environment by suspending an exit optical element of the plurality of optical elements at a predetermined distance from a seat formed by a lower part of the housing.

According to an aspect of the invention, a method for operating a detector in a gas-conditioned environment is provided. The method includes flowing a conditioned gas from a first gas-conditioned sub-environment to a second gas-conditioned sub-environment so as to prevent contamination from the second sub-environment to the first sub-environment, leaking conditioned gas at a predetermined rate from the second sub-environment to ambient atmosphere through at least one gate, and detecting at least one property of the second gas-conditioned environment with the detector.

According to an aspect of the invention, a lithographic apparatus is provided. The apparatus includes a projection system configured to project a patterned radiation beam onto a target portion of a substrate. The projection system includes a housing and a plurality of optical elements arranged in the housing. The apparatus also includes a gas controller for feeding and exhausting conditioned gas to and from the housing for providing a gas conditioned environment in the housing, and at least one gate for communicating the gas conditioned environment with ambient atmosphere. The gate is arranged to provide a predetermined leakage of the conditioned gas to the ambient atmosphere.

According to an aspect of the invention, a lithographic apparatus is provided. The apparatus includes a projection system configured to project a patterned radiation beam onto a target portion of a substrate. The projection system includes a housing and a plurality of optical elements arranged in the housing, and an exit optical element for exiting the radiation beam from the projection system. The apparatus also includes a gas controller for feeding conditioned gas to the housing for providing a gas conditioned environment in the housing, and a mount for mounting the exit optical element. The mount includes a suspension mounted on the exit optical element for suspending the exit optical element at a predetermined distance from a seat formed by a lower part of the housing so as to form a gas exhaust structure for exhausting the conditioned gas from the housing.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
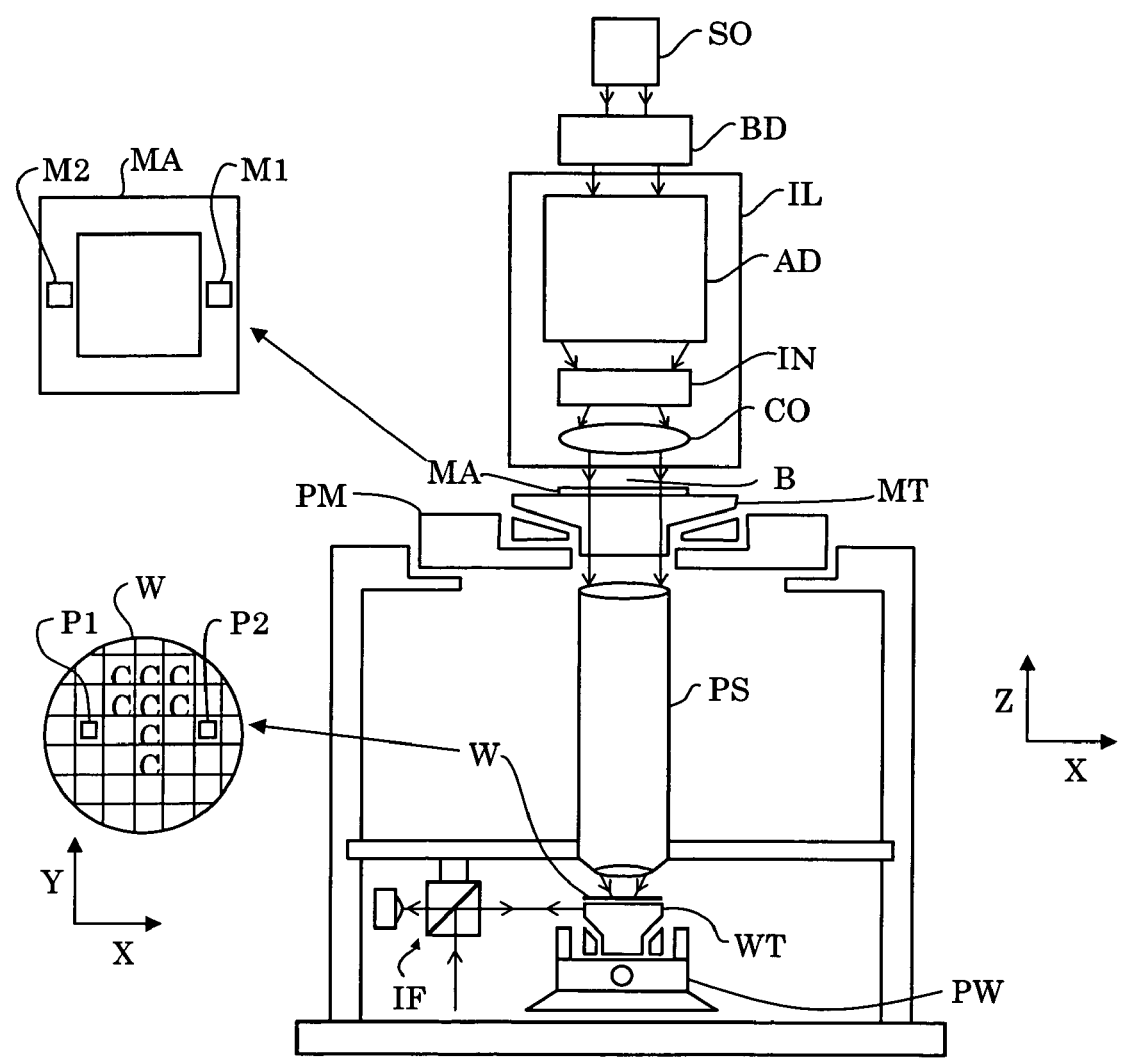
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation), a support structure (e.g. a mask table) MT constructed to support a patterning device (e.g. a mask) MA and connected to a first positioner PM configured to accurately position the patterning device in accordance with certain parameters, a substrate table (e.g. a wafer table) WT constructed to hold a substrate (e.g. a resist-coated wafer) W and connected to a second positioner PW configured to accurately position the substrate in accordance with certain parameters, and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure may use mechanical, vacuum, electrostatic or other clamping techniques to hold the patterning device. The support structure may be a frame or a table, for example, which may be fixed or movable as needed. The support structure may ensure that the patterning device is at a desired position, for example, with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if needed, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as needed after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
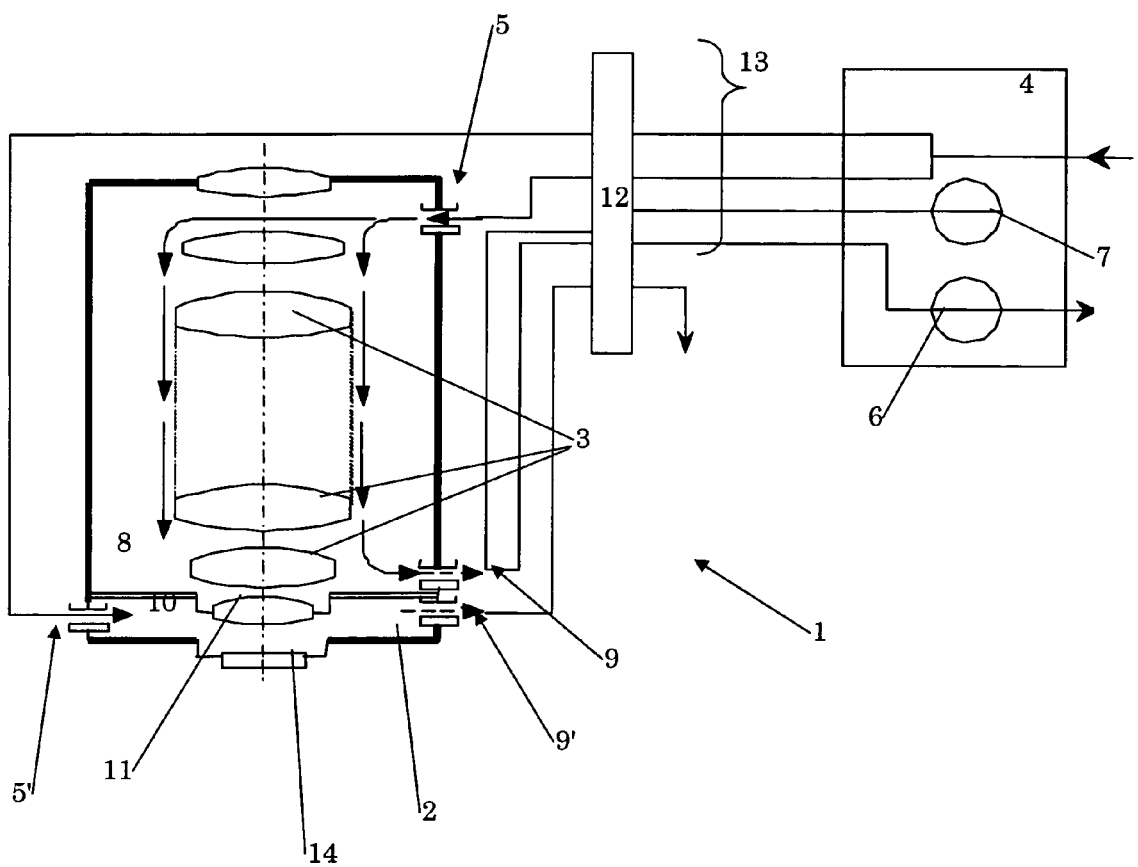
FIG. 2 shows an embodiment of a projection optical system according to the invention.

FIG. 2 shows an embodiment of a projection optical system according to the invention. In FIG. 2, a projection lens system 1 to be used for photolithographic purposes is schematically illustrated. The projection system 1 includes a housing 2 and a plurality of optical elements 3 arranged in the housing 2. A gas control unit or controller 4 is provided for controlling the feeding and conditioning of gas to be fed to the housing 2 via one or more gas inlets or "feeds" 5. The gas control unit 4 includes a flow meter 6 and a pressure meter 7 that are used for measuring the outflow of gas from the optical system. According to the embodiment, the projection optical system 1 is divided into separate compartments 8, 10, wherein an upper compartment 8 is formed as a closed compartment, directly connected to inlets 5 and exhausts 9 in communication with the gas control unit 4 and otherwise organized conventionally. In contrast, a lower compartment 10, physically separated from the upper compartment 8 by an optical element 11 (usually, the next to last optical element) is fed via a separate inlet 5', which is a feed that is provided from a splitting arranged in the gas control unit 4. The separation can however be at another position, depending on the sensitivity of the optical elements and which one are easiest to seal. Further, alternatively, this split may be provided more downstream of the gas flow (schematically indicated with arrowheads in the drawing), for example, in a split provided on an interface 12 between the lens housing 2 and the gas supply lines 13 that connect the interface 12 and gas control unit 4. In the lower compartment 10, the exhaust 9' is not directly connected via a feed back to the gas control unit 4 but instead is provided as a gate in fluid communication with the ambient atmosphere so that a controlled leakage of the conditioned gas to the ambient atmosphere is provided. In one embodiment, the rate of leakage may be controlled by the gate. Due to the generally very flexible nature of the exit optical element 14, pressure difference fluctuations between the gas conditioned compartment result in often unwanted optical behavior of the optical system due to mechanical deformation of the (exit) optical element 14. In this respect, in an electronic analogue, the lower compartment 10 may be viewed to provide a capacity for capacitating gas flow, where the inlets 5' and exhausts 9' define the impedance value of this flow circuit.

Inlets or feeds 5/5' can be considered flow sources generally. The C value is determined by the volume of the system, while mostly exhaust 9/9' determines the R value. Thus, lowering C and/or R makes the system response better.

Hence, an RC-circuit is provided such that when the capacity or impedance is lowered, faster response times for pressure fluctuations results, thus minimizing mechanical stress exerted on the exit optical element 14. Alternatively, the gas exhaust 9' may exhaust in a location different from interface 12.

Figure 3:
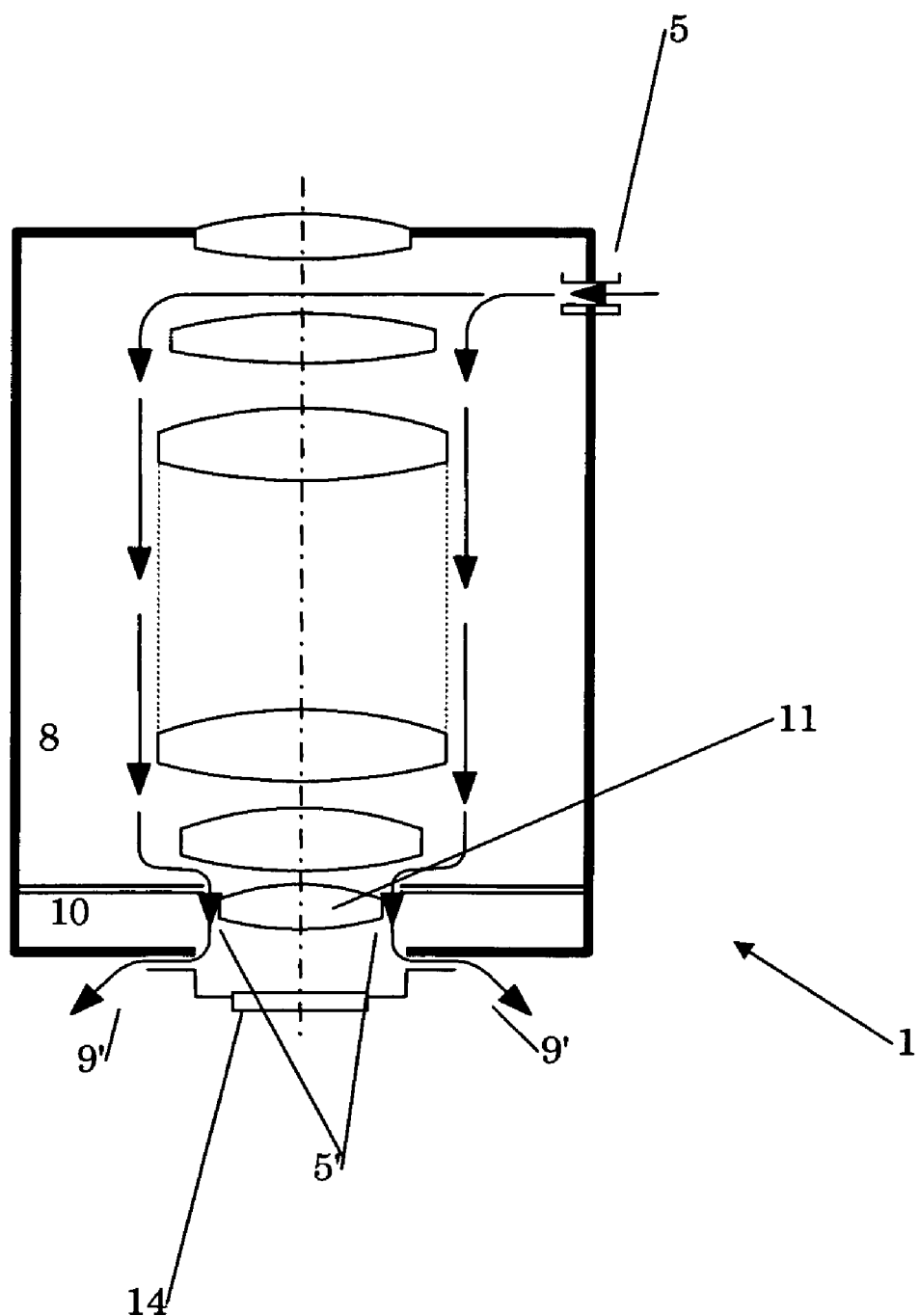
FIG. 3 shows an embodiment of a projection optical system according to the invention.

FIG. 3 shows an alternative embodiment in which, as in FIG. 2, a lower compartment 10 is fed by inlets 5' separately from the inlets 5 used for feeding conditioned gas to the upper compartment 8. Different from the embodiment illustrated in FIG. 2, the inlets 5' are now internally provided via mounts of the second final optical element. Although in FIG. 3 the separation is formed by the last and next to last optical element, this is not restrictive for the invention.

Thus, a gas flow for conditioning the projection system may be provided even without a direct feed back to the gas control unit illustrated with reference to FIG. 2. Instead, the gas flow is controlled to provide just a sufficient flow to prevent contamination from entering the lowest compartment, wherein the R-C values of the lowest compartments are arranged to provide minimal pressure fluctuations exerted on the exit optical element 14. Not illustrated, the gas flow may be restricted to prevent inflow in the ambient environment, for example, by providing a (not shown) gas extraction arrangement in the vicinity of the exhausts 9' as further explained with reference to FIG. 4 and FIG. 7.

Figure 4:
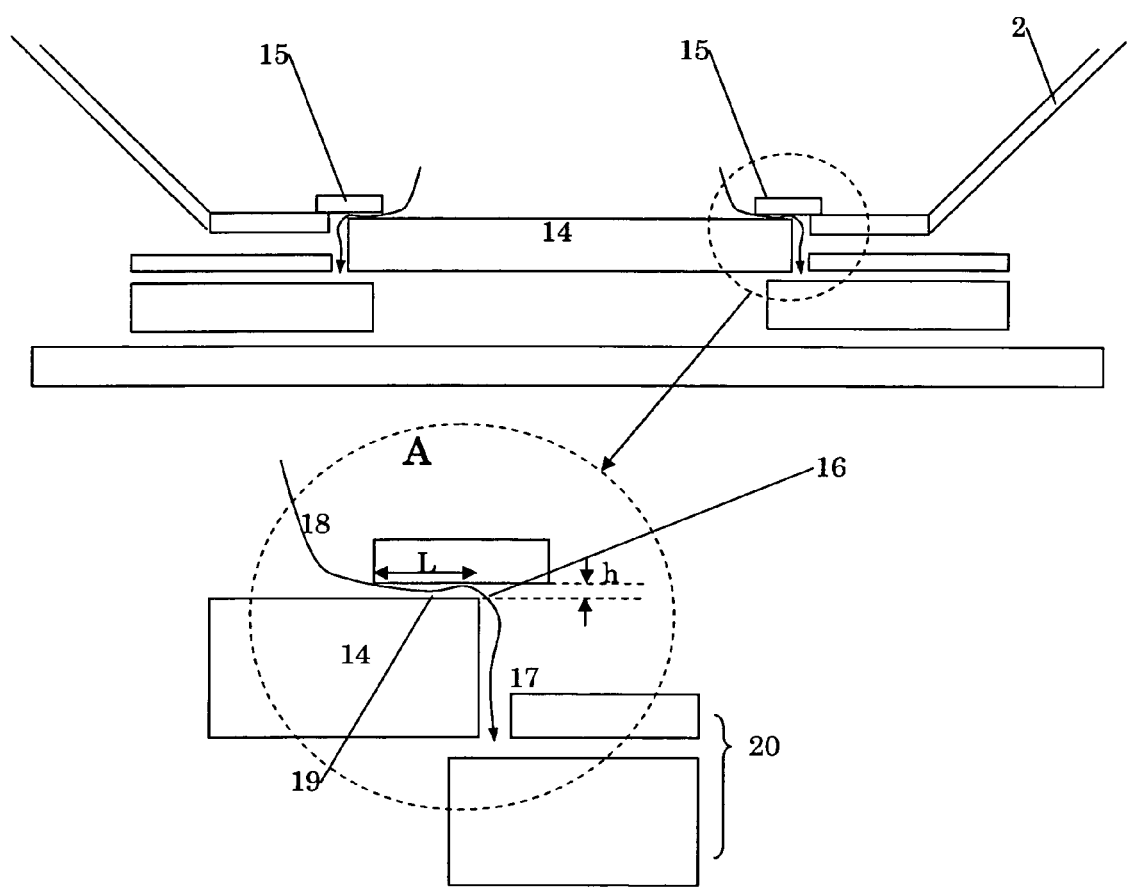
FIG. 4 shows an embodiment of a projection optical system according to the invention.

FIG. 4 and enlarged section FIG. 4A illustrate a further embodiment which takes advantage of the concept of the invention. At the same time, the embodiment illustrated in FIG. 4 provides an arrangement that radically obviates suspension problems encountered thus far, specifically, problems in providing a leak tight seal of the exit optical element 14. Conventionally, such a seal was provided by bonding of the exit optical element 14 to the lens housing 2, which resulted in problems since, for example, thermal effects or wear effects caused mechanical deformation which resulted in degradation of optical performance. According to the invention, however, the "seal" is leaking so as to form a gas exhaust structure for exhausting conditioned gas from the housing 2 and is provided by a suspension mounted on the exit optical element 14, for suspending the exit optical element 14 at a predetermined distance h from a seat 15 formed by a lower part of the housing 2. FIG. 4A shows that in this respect the outflow opening 16 between the exit optical element 14 is dimensioned to provide a diffusion barrier between ambient atmosphere gas 17, present outside the optical system 1 and conditioned gas 18, present inside the optical system 1. In this respect, the diffusion barrier is formed by an elongate, narrow gas channel 19 providing communication of the gas conditioned environment 18 with ambient atmosphere 17.

The dimensions of the channel 19 are specifically designed to prevent contamination from the ambient environment 17 as will be illustrated below. Further, to prevent "contamination" of the ambient atmosphere, a gas extraction device 20 is mounted near the outflow opening of the channel 19 to exhaust leaked conditioning gas.

As an example, for a specific design, dimensions of the diffusion barrier were calculated as illustrated in FIG. 4A. Design parameters included: an overpressure of 100 Pa in the lens housing 2 and a leak flow approximately 0.1-10 Nl/h.

The diffusion barrier can be calculated with the following formulas:

$$C = C_0 \cdot \frac{1}{e^{\frac{u \cdot L}{D}} - 1} \approx C_0 \cdot e^{-\frac{u \cdot L}{D}}$$

$$K = \frac{u \cdot L}{D} > \ln\left(\frac{C_0}{C}\right)$$

Here, C stands for the internal concentration; $C_0$ for the external concentration of a contaminant; u represents the mean velocity in the gap [m/s]; L the length of the gap [m]; D a diffusion coefficient [m2/s] and K expresses the diffusion barrier [−]. A practical value for such a barrier was calculated to be 10-20.

The gas output should be limited, since it can disturb other environmental parameters, such as an interferometric system of a wafer stage that moves under the lens. From this constraint, the minimum gap height may be calculated using the pressure drop (100 Pa) and the diffusion barrier calculated above.

Figure 5:
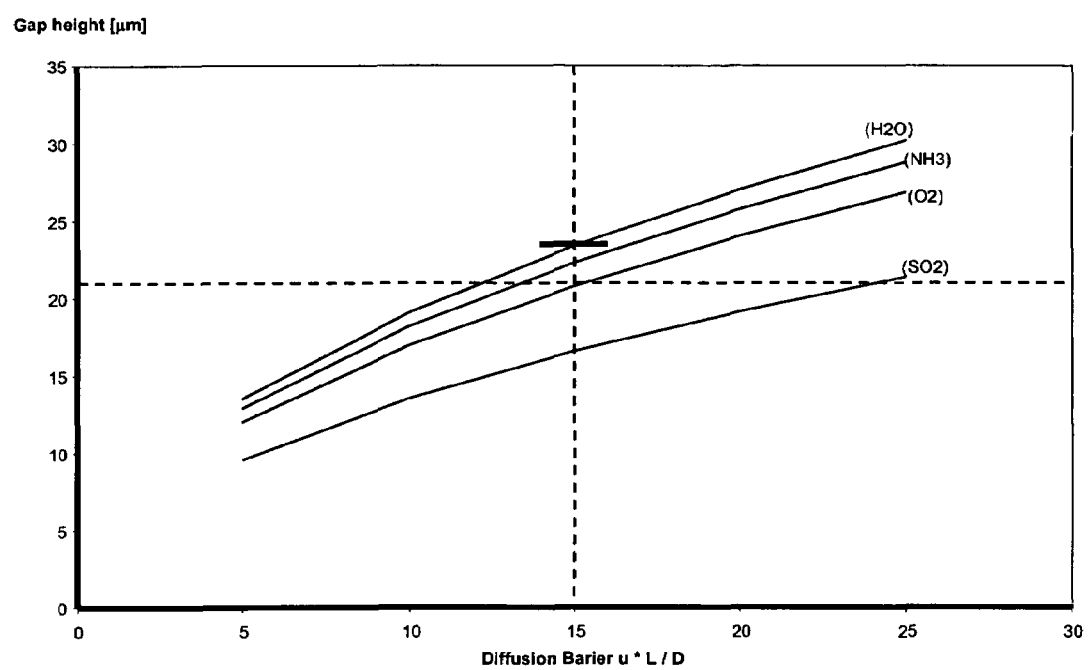
FIG. 5 shows a graph showing results for dimensioning a gate in communication with the ambient environment according to the invention.

FIG. 5 shows a graph with the results of this analysis for a few contaminants. To meet the specifications to the main contaminants $O_2$, $H_2O$, $SO_2$, and $NH_3$, it was found that a minimum gap height should be in the order of 20-25 μm with a length of 5-10 mm.

Figure 6:
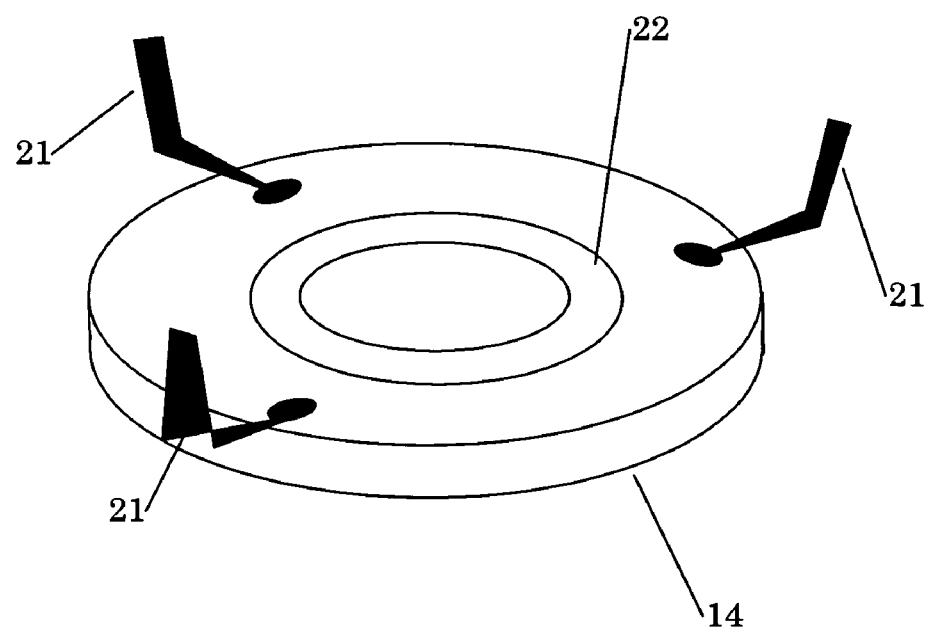
FIG. 6 shows a schematic perspective view of an exit optical element designed according to the invention.

FIG. 6 shows a further schematic view of the exit optical element 14 in the arrangement illustrated in FIG. 4. The exit optical element 14 includes a flat plate that is kinematically mounted by suspension brackets 21, bonded to the plate. The brackets 21 are formed to prevent occurrence of planar stress in the plate, that is, the brackets 21 are designed to provide room for lateral movements of the brackets. Thus, the brackets 21 are arranged to provide suspension to the exit optical element 14 only from a face side of the optical element 14, leaving some freedom of movement in the planar direction of the exit optical element 14.

Figure 7:
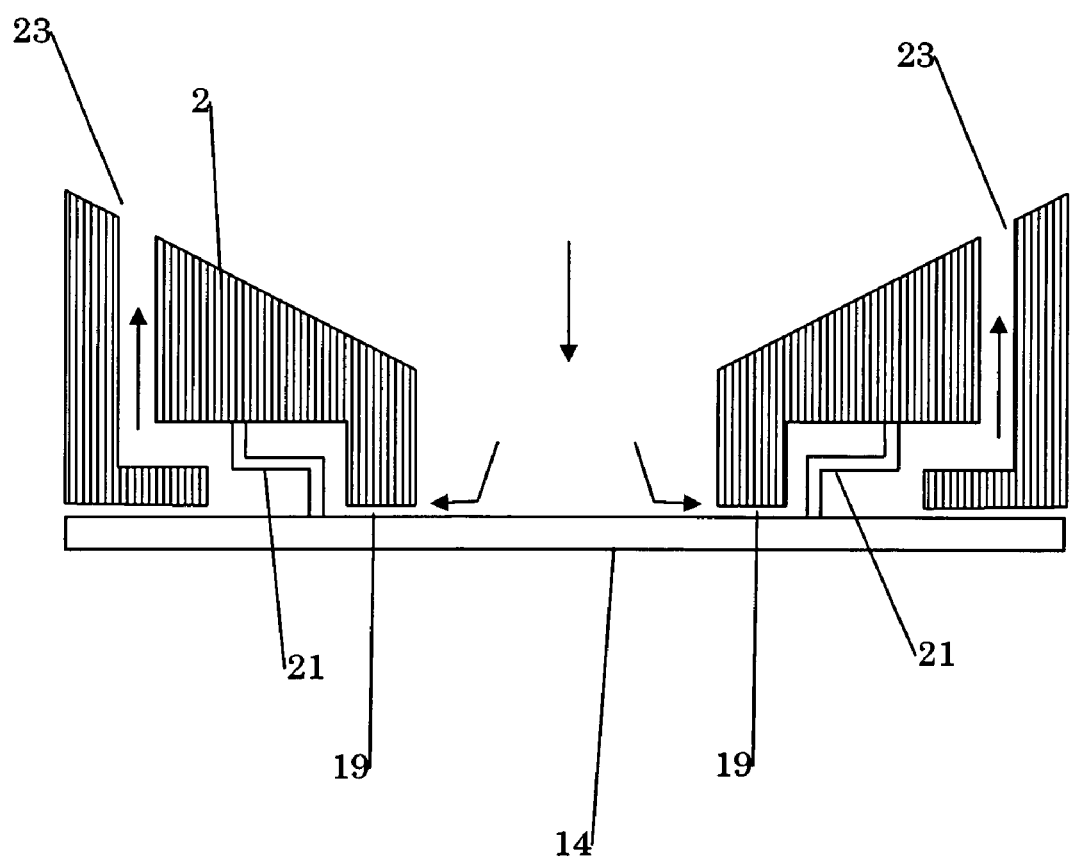
FIG. 7 shows the embodiment of FIG. 6 in a mounted condition.

Schematically illustrated in FIG. 6 is the area 22 where opposite of the plate a seat (see FIG. 7) of the lens housing 2 is arranged to form the elongate channel 19 by two opposite plates as discussed with reference to FIG. 4. The brackets 21 connect, as illustrated in FIG. 7, the exit optical element 14 to the lens housing 2 meanwhile suspending the element at a predetermined distance to form the channel structure 19. Furthermore, FIG. 7 shows the suspension of the exit optical element 14 in a schematic side view. Also illustrated is an extraction arrangement 23 for preventing out flowing conditioning gas to contaminate the environment.

Figure 8:
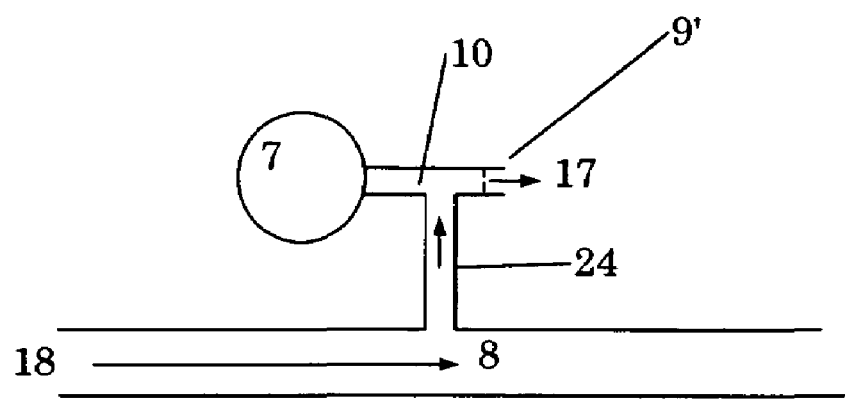
FIG. 8 shows a schematic setup for a sensor mounted according to one aspect of the invention.

FIG. 8 shows a schematic setup for a pressure sensor 7 (or any other sensor, or a check valve), as illustrated in FIG. 2, mounted according to one aspect of the invention. In this respect, the sensor 7 is in direct communication with gas-conditioned environment 18. This way, a property of the gas-conditioned environment 18 may be detected. By using the above elaborated design rules, a diffusion barrier can be constructed in which the contamination of the sensor is prevented to enter the environment 18. This allows for the use of a "dirty" sensor 7, which greatly simplifies cost, construction and maintenance aspects of the pressure detector to be used in an ultra-clean environment. This concept, however, may also be applied to different types of sensors, for example, a flow sensor or another sensor measuring a quantity of interest in the gas-conditioned environment 18. To this end, the invention proposes a method for operating a detector 7 in a gas-conditioned environment including: arranging the environment in two sub-environments 8, 10 in open communication with each other; providing a conditioned gas flow 24 from the first sub-environment to the second sub-environment, so as to prevent contamination from the second environment to the first environment; providing in the second sub-environment at least one gate 9' for providing communication of the gas conditioned environment with ambient atmosphere arranged to provide a controlled leakage of the conditioned gas to the ambient atmosphere; and arranging the detector 7 in the second gas-conditioned environment. According to the embodiment shown, the detector 7 is a pressure detector. However, the invention is not restricted to this type of detector and other detectors can be used, for example, a temperature sensor, an oxygen sensor, a water sensor, an intensity detector, or the like. Moreover, the detector may also be a relief valve.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a projection system configured to project a patterned radiation beam onto a target portion of a substrate, said projection system comprising a housing and a plurality of optical elements arranged in said housing;
   a gas control unit configured to control the feeding of conditioned gas into said housing;
   an inlet configured to feed said conditioned gas into said housing to provide a gas conditioned environment in said housing, wherein said inlet is controlled by the gas control unit;
   a gas exhaust configured to exhaust said conditioned gas from said housing, wherein said gas exhaust is in communication with said gas control unit; and
   at least one gate configured to communicate said conditioned gas into the ambient atmosphere, wherein said gate is always open between said housing and the ambient atmosphere and is arranged to provide a leakage of said conditioned gas to the ambient atmosphere.

2. A lithographic apparatus according to claim 1, wherein said gate comprises an outflow opening that is dimensioned to provide a diffusion barrier between said ambient atmosphere and said gas conditioned environment.

3. A lithographic apparatus according to claim 2, wherein said diffusion barrier is formed by an elongate, narrow gas channel providing communication of said gas conditioned environment with said ambient atmosphere.

4. A lithographic apparatus according to claim 2, wherein a pressure and/or flow sensor is mounted outside the diffusion barrier formed by said gate.

5. A lithographic apparatus according to claim 1, wherein a gas extraction device is mounted near said gate to exhaust leaked conditioned gas.

6. A lithographic apparatus according to claim 1, wherein the optical elements are mounted to provide a gas flow to said at least one gate.

7. A lithographic apparatus according to claim 1, wherein said at least one gate is provided in a lowest section of said housing, said lowest section bounded by an exit optical element configured to exit the radiation beam from the optical system.

8. A lithographic apparatus according to claim 7, wherein said gate is formed by a mount configured to mount said exit optical element.

9. A lithographic apparatus according to claim 8, wherein said mount comprises a suspension mounted on said exit optical element configured to suspend said exit optical element at a distance from a seat formed by a lower part of said housing.

10. A lithographic apparatus according to claim 8, wherein said mount is arranged to mount said exit optical element free from in-plane compression forces.

11. A lithographic apparatus according to claim 10, wherein said mount comprises a suspension element configured to suspend said exit optical element only from one face side of said optical element.

12. A lithographic apparatus according to claim 8, wherein said mount is a kinematical mount.

13. A lithographic apparatus according to claim 1, wherein said inlet comprises a plurality of gas inlets configured to feed gas to compartmented sections of said housing.

14. A lithographic apparatus according to claim 1, wherein only a lower section of said housing is communicatively in contact with the ambient atmosphere.

15. A lithographic apparatus comprising:
a projection system configured to project a patterned radiation beam onto a target portion of a substrate, said projection system comprising a housing and a plurality of optical elements arranged in said housing, and an exit optical element configured to exit said radiation beam from said projection system;
an inlet configured to feed conditioned gas into said housing to provide a gas conditioned environment in said housing; and
a mount configured to mount said exit optical element, said mount comprising a suspension mounted on said exit optical element configured to suspend said exit optical element at a distance from a seat formed by a lower part of said housing so as to form a gas exhaust structure configured to exhaust said conditioned gas from said housing.

16. A lithographic apparatus according to claim 15, wherein said mount comprises a suspension element configured to suspend said exit optical element only from one face side of said optical element.

17. A lithographic apparatus according to claim 15, wherein said mount is a kinematical mount.

18. A device manufacturing method comprising:
projecting a patterned beam of radiation onto a target portion of a substrate with a projection system, said projection system comprising a housing and a plurality of optical elements arranged in said housing;
providing a first gas conditioned sub-environment enclosed from the ambient atmosphere in a first compartment having a first optical element within said housing, said first compartment having an inlet configured to feed conditioned gas into said first compartment and a gas exhaust configured to exhaust said conditioned gas from said first compartment; and
providing a second gas conditioned sub-environment not enclosed from the ambient atmosphere in a second compartment having a second optical element within said housing, said second compartment having at least one gate configured to communicate said gas conditioned environment with the ambient atmosphere so as to provide a controlled leakage of conditioned gas into the ambient atmosphere, wherein said gate is always open between said gas conditioned environment and the ambient atmosphere.

19. A device manufacturing method comprising:
projecting a patterned beam of radiation onto a target portion of a substrate with a projection system, said projection system comprising a plurality of optical elements arranged in a gas conditioned environment; and
exhausting conditioned gas from said gas conditioned environment through an opening formed by suspension of an exit optical element of said plurality of optical elements at a distance from a seat formed by a lower part of a housing of said projection system.

20. A lithographic apparatus comprising:
a projection system configured to project a patterned radiation beam onto a target portion of a substrate, said projection system comprising a housing and a plurality of optical elements arranged in said housing, and an exit optical element configured to exit said radiation beam from said projection system;
a gas controller configured to feed conditioned gas to said housing to provide a gas conditioned environment in said housing; and
a mount configured to mount said exit optical element,
said mount comprising a suspension mounted on said exit optical element configured to suspend said exit optical element at a distance from a seat formed by a lower part of said housing so as to form a gas exhaust structure to exhaust said conditioned gas from said housing.

* * * * *

UNITED STATES PATENT AND TRADEMARK OFFICE
CERTIFICATE OF CORRECTION

| | | |
|---|---|---|
| PATENT NO. | : 7,446,849 B2 | Page 1 of 1 |
| APPLICATION NO. | : 10/896000 | |
| DATED | : November 4, 2008 | |
| INVENTOR(S) | : Tjarko Adriaan Rudolf Van Empel et al. | |

It is certified that error appears in the above-identified patent and that said Letters Patent is hereby corrected as shown below:

On the title page, item (75) Inventors, replace "Bernard Gellrich" with --Bernhard Gellrich--.

Signed and Sealed this

Twelfth Day of May, 2009

JOHN DOLL
*Acting Director of the United States Patent and Trademark Office*